United States Patent
Tamura

[11] Patent Number: 6,037,654
[45] Date of Patent: Mar. 14, 2000

[54] SEMICONDUCTOR DEVICE, TAPE CARRIER PACKAGE, AND DISPLAY PANEL MODULE

[75] Inventor: Tsuyoshi Tamura, Nagano-ken, Japan

[73] Assignee: Seiko Epson Corporation, Tokyo, Japan

[21] Appl. No.: 08/704,513

[22] PCT Filed: Jan. 12, 1996

[86] PCT No.: PCT/JP96/00040

§ 371 Date: Nov. 27, 1996

§ 102(e) Date: Nov. 27, 1996

[87] PCT Pub. No.: WO96/21948

PCT Pub. Date: Jul. 18, 1996

[30] Foreign Application Priority Data

Jan. 13, 1995 [JP] Japan ......................................... 7-4486
Mar. 17, 1995 [JP] Japan ....................................... 7-59139

[51] Int. Cl.[7] .......................... H01L 23/495; H01L 23/48; H01L 29/04; H01L 23/52
[52] U.S. Cl. .......................... 257/668; 257/786; 257/773; 257/72; 257/59
[58] Field of Search .................................... 257/668, 786, 257/773, 672, 673, 72, 59

[56] References Cited

FOREIGN PATENT DOCUMENTS

| 2-23663 | 1/1990 | Japan . |
| 3-46691 | 2/1991 | Japan . |
| 5-326622 | 12/1993 | Japan . |
| 6-21144 | 1/1994 | Japan . |
| 63-93125 | 4/1998 | Japan ..................................... 257/786 |

Primary Examiner—Mahshid Saadat
Assistant Examiner—Jesse A. Fenty
Attorney, Agent, or Firm—Loeb & Loeb LLP

[57] ABSTRACT

Electrodes for electrically connecting to the outside are formed along one long side of a rectangular semiconductor chip 20. The electrodes are arranged in two rows, one of output terminals 21 and the other of input terminals 22 and power supply terminals 23, or are arranged in one row of the output terminals, input terminals and power supply terminals. Input protective resistors and static electricity protective diodes 28 for the input terminals are located outside the output terminals to be separated from the output system by at least the size of the output terminals. The external circuit connected to the output terminals 21 of the semiconductor device, for example the wiring 35 extending from the inner leads 33 of a tape carrier 29 are routed inside the electrodes toward the opposite long side of the semiconductor device, so that the wiring area overlaps the top of the semiconductor device in a plan view. Therefore, the mounting area of the semiconductor device can be largely reduced, the package density can be increased, and the longitudinal dimension of a TCP can be minimized.

15 Claims, 11 Drawing Sheets

SEMICONDUCTOR DEVICE, TAPE CARRIER PACKAGE, AND DISPLAY PANEL MODULE

TECHNICAL FIELD

The present invention relates to the layout of electrodes on a semiconductor device to connect it to an external circuit, and in particular relates to a tape carrier package (TCP) which includes a semiconductor chip mounted on a tape carrier by using the tape automated bonding (TAB) technology. The present invention also relates to a display panel module which comprises a flat-type display panel, such as a liquid crystal display (LCD) or a plasma display, equipped with semiconductor chips for driving the same.

BACKGROUND ART

A tape carrier package (hereinafter referred to as TCP) made by the TAB or tape automated bonding method has been used broadly in the field of the semiconductor packaging technology, because it enables to maximize the number of pins and also to minimize the pitch of or distance between leads, so as to meet the requirements, due to the recent trend toward higher-level function and higher integration of a semiconductor chip, to increase the number of electrodes, to make the electrode pitch finer, and to make the chip size larger. In the prior art, the electrodes of a TCP have been arranged along two or all four sides on the surface of a semiconductor chip, as described in Japanese Patent Laying-open Publications Nos. 4-22146 and 5-326622. Another Japanese Patent Laying-open Publication No. 63-84039 also discloses a structure for packaging a TCP, in which bumps are formed in the central area on the surface of a semiconductor chip, so that the outer leads of a tape carrier to connect to said bumps are routed inward of the chip, and thus minimizing its mounting area and achieving higher package density. Further, the international publication No. WO91/16656 of this applicant discloses a semiconductor chip in which output electrodes are formed along a longitudinal center line of the rectangular chip.

In most liquid crystal displays, TCPs have been employed to mount driver semiconductor chips for driving a LCD, because a back-light unit can be installed to the display panel very easily and also because TCPs are suitable for automating the mounting process. Here, it is advantageous to configure the driver chips in the form of long and narrow rectangle, and to locate input and output electrodes along the opposite long sides of the rectangular chip respectively, as described in the above Japanese Publication No. 5-326622, in order to shorten the width of a TCP so that the so-called frame portion of a LCD panel is diminished.

While the longitudinal dimension or length of a TCP on which the above-mentioned long and narrow rectangular chip is mounted is generally determined by the number of electrodes and its pitch size of the chip, the lateral dimension or width of the TCP is determined mainly by 1) length of input and output outer leads, 2) length of input and output inner leads, 3) wirings routed on a tape carrier to connect the inner leads and the outer leads, and 4) length of the short side of the chip. FIGS. 10 and 11 show such a TCP as one typical example of the prior art. In the drawings, TCP 1 includes a semiconductor chip 2 as a LCD driver which is positioned in the device hole 4 formed in the center of a tape carrier 3. On the top surface of the chip 2, a number of output electrodes 5 and input electrodes 6 are arranged in one row along the opposed long sides of the chip respectively, and are bonded to inner leads 7, 8 formed to project into the device hole 4. The inner leads connect to outer leads 11, 12 by wirings 9, 10 formed on the surface of the tape carrier 3.

In this example of the prior art, the length of the outer leads 11 and 12 are determined, to some extent, by the conditions of mounting said TCP to a LCD panel and connecting it to an external input circuit, and the length of the inner leads 7 and A are determined partly by the size and pitch etc of said electrodes of the chip 2. Length of the short side of the chip 2 can be usually shortened by improving the degree of integration of the chip so that the chip size is reduced, though there is of course always a physical limitation. Moreover, there is another problem that the chips will become expensive, because machinery necessary for manufacturing such semiconductor chips of higher degree of integration are very expensive and also the manufacturing cost will be increased. Consequently, in order to achieve reduction in the size of a TCP, it is preferred to reduce the mounting area of the semiconductor chip 2 by particularly reducing the wiring area for the output wiring 10 on the surface of the tape carrier, in consideration that the number of the output electrodes is larger. However, there is a technical limitation in making the outer lead pitch finer. Further, it is sometimes required to make pitch of the outer lead 12 larger depending upon the conditions of connecting to the outside. In such a case, wiring 10 must be curved when routed on the tape carrier 3, so that it becomes longer and hence the width of the TCP 1 becomes larger.

In contrast, the above Japanese Publication No. 5-326622 discloses a technique to eliminate the conventional curved pattern from the wirings on a tape carrier by arranging the electrodes on the chip at a pitch equal to that of the outer leads of the tape carrier to make the output leads of the tape carrier straight, so that the size of a TCP can be reduced. However, the problems with this prior art technique are that because the outer lead pitch decides the electrode pitch which in turn decides the size of the chip, downsizing of a chip has been difficult to achieve and the manufacturing cost of the chips has increased, and that the design flexibility of a TCP has been limited by the number and pitch of electrodes of a semiconductor chip.

Therefore, in order to eliminate the above mentioned defects and problems of the prior art, the present invention is to provide a semiconductor device comprising a semiconductor chip, for example a driver chip for driving a flat type display panel such as a LCD panel, said chip including a number of electrodes on the surface thereof, in which the mounting area can be reduced while the integration degree and size of the chip are properly balanced with its manufacturing cost.

It is another purpose of the invention to provide a tape carrier package having semiconductor chips mounted thereon, said chips including a number of electrodes as described above, in which the size and cost can be reduced while holding down the manufacturing cost of the chips.

It is also a purpose of the invention to provide a flat type display panel module which is able to reduce the size of the entire device and to substantially enlarge the display area by reducing the frame portion on which the driver semiconductor chips are mounted.

DISCLOSURE OF THE INVENTION

A semiconductor device of this invention is designed to achieve the above mentioned purposes, being characterized in that electrodes for electrically connecting to the outside are formed along one long side of a rectangular semiconductor chip and that circuit cells are arranged inside the electrodes. When this semiconductor device is mounted onto an external circuit such as a circuit board, a tape carrier or the like, the wirings from the electrodes of said external circuit or from the inner leads of the tape carrier are routed inward of the electrodes of said semiconductor device and towards the opposite long side of the chip, so that mounting area of the circuit board etc. can be largely reduced. Therefore, the cost of an individual semiconductor chip can be maintained at a proper low price level in relation to its integration degree and size, and at the same time the mounting area can be largely reduced to increase the packaging density, so that both downsizing and high density packaging of the electronic machines can be achieved.

Preferably, the electrodes of the semiconductor device may comprise input terminals, output terminals and power supply terminals, and said input terminals and power supply terminals are arranged outside said output terminals on the chip surface. In particular, when the number of output terminals is larger than that of the input and power supply terminals, the mounting area for the outputs becomes larger than that for the inputs, so that the mounting area can be reduced more effectively. Also, the output terminals can be divided into two or more blocks, and the blocks can be separated from each other by a space larger than the pitch of the output terminals of said blocks. With this arrangement, the routing of the output wirings can be designed more freely so that the design flexibility of a semiconductor chip is increased. Further, when such a semiconductor device is mounted on a tape carrier, there are provided enough spacings between the blocks within the row of the output terminals, so that a molding resin material can be filled through the spacings uniformly into a wide area inside the row of output terminals between the chip and the tape carrier.

In another embodiment, it is preferred that all the electrodes of the semiconductor chip comprising input terminals, output terminals and power supply terminals are arranged in one row, so that the mounting area can be reduced and the width or the longitudinal dimension of the chip can be shortened. In this case, the output terminals may be divided into two or more blocks with the input terminals arranged between said blocks of the output terminals, and the power supply terminals arranged at both ends of the row of electrodes, resulting that the design flexibility of the output wirings can also be increased, and at the same time, when mounting on a tape carrier, a molding resin material can be filled uniformly through the spacings formed between the blocks of the row of output terminals.

Also, it is preferred that the input protective resistors and static electricity protective diodes for said input terminals are arranged outside said output terminals, so that the resistors and the diodes are separated by least the width of the output electrodes from the output system of the semiconductor chip, to eliminate any influence caused by surges within the input system from being exerted on the output system.

In case where the semiconductor device of the present invention comprises a semiconductor chip which is a driver for driving a flat type display panel, and includes a number of electrodes on the chip surface comprising said output, input and power supply terminals, said output terminals including terminals to send drive signals to said display panel, and said input terminals including terminals to receive serial data and terminals to receive clock signals for converting said serial data into parallel signals, a large area is available for the wirings, so that the mounting area can be reduced effectively.

Further, according to the present invention, there is provided a tape carrier package comprising a tape carrier, and a semiconductor chip having electrodes that are connected to inner leads of said tape carrier, characterized by that said electrodes are arranged along one long side of the rectangular chip, and circuit cells are arranged inside said electrodes. Thus, the routing of the wirings extending from the inner leads on a tape carrier can be arranged inside the electrodes of the chip towards its opposite long side, so that the wiring area overlaps the top of the semiconductor chip in a plan view, thus enabling to reduce the longitudinal dimension of the tape carrier or the TCP, and to decrease the manufacturing cost thereof. Also it enables to increase design flexibility of the wirings and outer leads of a TCP, so that the cost of the chip can be maintained at a lower level while reducing the size of the TCP.

In the TCP of the invention, it is preferred that said electrodes of the semiconductor chip comprise input terminals, output terminals and power supply terminals, and the inner leads connected to said output terminals are routed inside said output terminals towards the opposite long side, so that because a larger area is available for the output wirings than for the input wirings, the longitudinal dimension of the tape carrier can be reduced more effectively. Also, in case where said semiconductor chip is a driver for driving a flat type display panel, and includes a number of electrodes which comprises said output terminals including terminals to send out drive signals to said display panel, and said Input terminals including electrodes to receive serial data and electrodes to receive clock signals for converting said serial data into parallel signals, the wiring area becomes larger that much, so that the effect to reduce the longitudinal dimension of a TCP is enhanced.

Further, according to the invention, there is provided a display panel module comprising a flat type display panel and a plurality of tape carrier packages that are connected to the display panel along the periphery thereof and include a semiconductor chip for driving said display panel respectively, characterized by that electrodes of said semiconductor chip connected to inner leads of said tape carrier packages are arranged along one long side of the rectangular chip, and circuit cells are arranged inside said electrodes. With this arrangement, because the longitudinal dimension of the TCP can be reduced as mentioned above, the so-called frame portion of the display panel module necessary for mounting a driver semiconductor chip can be reduced. Accordingly, there may be provided a display device having smaller size of the entire device and substantially enlarged display portion to offer better view.

BEST MODE FOR CARRYING OUT THE INVENTION

The preferred embodiments of this invention will now be described by way of example with reference to the accompanying drawings.

Figure 1:
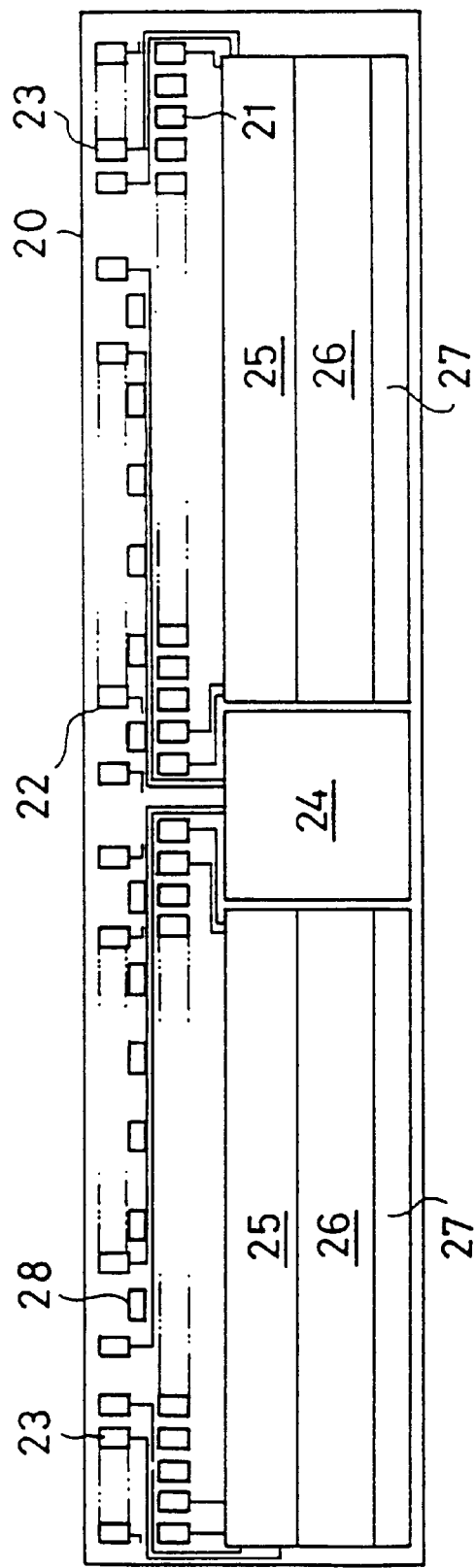
FIG. 1 shows a plan view of a first embodiment of the semiconductor device according to the present invention.

In FIG. 1, there is shown the first embodiment of a semiconductor device in accordance with the present invention. A semiconductor chip 20 is a driver in the form of a long and narrow rectangle for driving a LCD, being provided on the surface thereof with a number of electrodes formed in two rows along one long side or the upper side in the attached drawing. The electrodes comprise two-hundred and forty output terminals being arranged in one row at a constant pitch of about 60 microns, and thirteen input terminals 22 and fourteen power supply terminals 23 being arranged in one row outside said output terminals. The area between said electrodes and the opposite side of the chip is divided into seven blocks comprising a circuit cell respectively. A logic region 24 including data control and clock buffer etc. is located in the center, and on both sides thereof are located driver output divisions 25 having outputs of the same number as that of said driver, driver control divisions 26, and latch divisions 27 for holding serial data. The driver output divisions, the driver control divisions and the latch divisions are formed in parallel to extend longitudinally and each have a width of about 50 microns, so that the semiconductor chip 20 is formed long and narrow.

In this embodiment, the row of output terminals and the row of input and power supply terminals are separated by the distance of about 150 microns, which is sufficient to prevent shorting of inner leads of a tape carrier that may occur when mounting the semiconductor chip 20 thereon as being described hereinafter. In case the semiconductor chip 20 is mounted directly on the surface of a circuit board instead of a tape carrier, the distance between said rows of electrodes can be reduced to about 20 microns.

A gap of about 500 microns which is wider than said pitch is formed in the center of the row of output terminals 21 and separates the terminals left and right into two groups. The terminals of each group are connected to the corresponding driver output divisions 25 on either side respectively. The input terminals 22 comprise eight serial data input terminals, one clock terminal for latching data, one latch terminal for temporarily holding all data, one terminal for controlling which of the driver output divisions to produce driving outputs corresponding to the serial data, one signal terminal for producing alternation to drive liquid crystal, and one signal terminal for enforcedly keeping the driving outputs to a fixed low level irrespective of data or alternation signals. The power supply terminals 23 comprise two power supply terminals for the logic region, and twelve power supply terminals in two groups for the driver system. Said groups of the power supply terminals for the driver system are located at both ends of the row of input terminals respectively, and are connected to the ends of the corresponding driver output division 25 and the driver control division 26. The input terminals 22 are arranged at a certain interval between the left and right power supply terminals 23, the wirings extending from the input terminals are connected to the logic region 24 passing through the gap in the center of the row of output terminals. With this arrangement, it is able to reduce the area for the wirings from the input terminals to half in comparison with where the logic region 24 is located at left or right end of the chip 20.

Also, in this embodiment, static electricity protective resistors and diodes 28 connected to the input terminals 22 are arranged between the input terminals and the output terminals 21. In a semiconductor device according to the prior art, the static electricity protective resistors and diodes for the inputs are located remote from the driver outputs, and there is no need to consider such problems as that surge within the input system affects the driver system to cause latch up. On the contrary, according to the present invention, because the output terminals from the drivers are formed close to the input terminals, the static electricity protective resistors and diodes 28 for the inputs can be separated by at least the size of said output terminals from the driver system that includes the static electricity protective resistors and diodes connected to the output terminals 21. Thus it may effectively prevent the surge of the inputs from affecting the driver system. In protection from surge coming from the static electricity protective resistors and diodes for the outputs, however, necessary measures to prevent latch up have been taken beforehand. Further, the static electricity protective resistors and diodes for the inputs are only required to be located outside the output terminals 21, and may be located outside or between the rows of input terminals 22 and 23.

Figure 2:
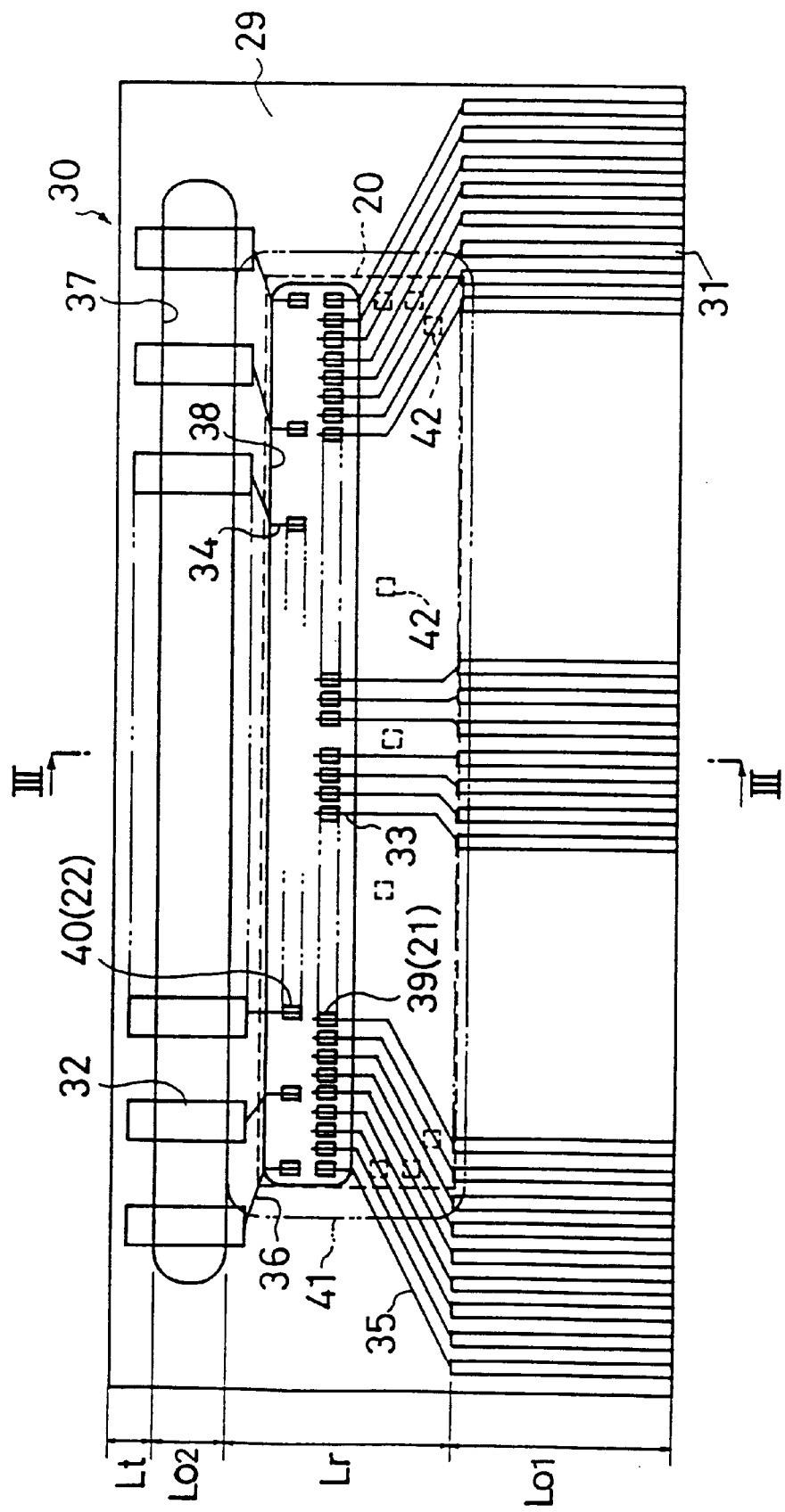
FIG. 2 shows a plan view of a TCP including the semiconductor device of FIG. 1.

In FIG. 2, there is shown a TCP 30 having the semiconductor chip 20 of FIG. 1 mounted on a tape carrier 29 which comprises an insulating film of about 25 microns thickness formed by common materials. The tape carrier 29 has outer leads 31, 32, inner leads 33, 34 and wirings 35, 36 to connect said outer leads and inner leads, that are formed by etching and patterning a copper foil of about 20 microns bonded on the surface of the film. The output outer leads 31 are arranged at a constant pitch of 70 microns along one long side of the rectangular tape carrier. The input outer leads are arranged along the opposite long side, and are exposed to the back side through slits 37 formed in the tape carrier 29.

A device hole 38 is formed in the tape carrier 29 at the position closer to the input outer leads rather than the center thereof, and both input and output inner leads 33, 34 project into the opening of the device hole from both side edges thereof to extend in the opposite directions with each other. Since all the electrodes of the semiconductor chip 20 are arranged along said one long side, the size of the device hole 38 may be decided to be smaller than the outline of the chip 20 and to be large enough to enclose the electrodes within the opening. Therefore, in comparison with the prior art TCP having a device hole which is larger in size than the outline of a semiconductor chip, the present invention can reduce the length of the inner leads 33, 34 projecting into the device hole 38.

Figure 3:
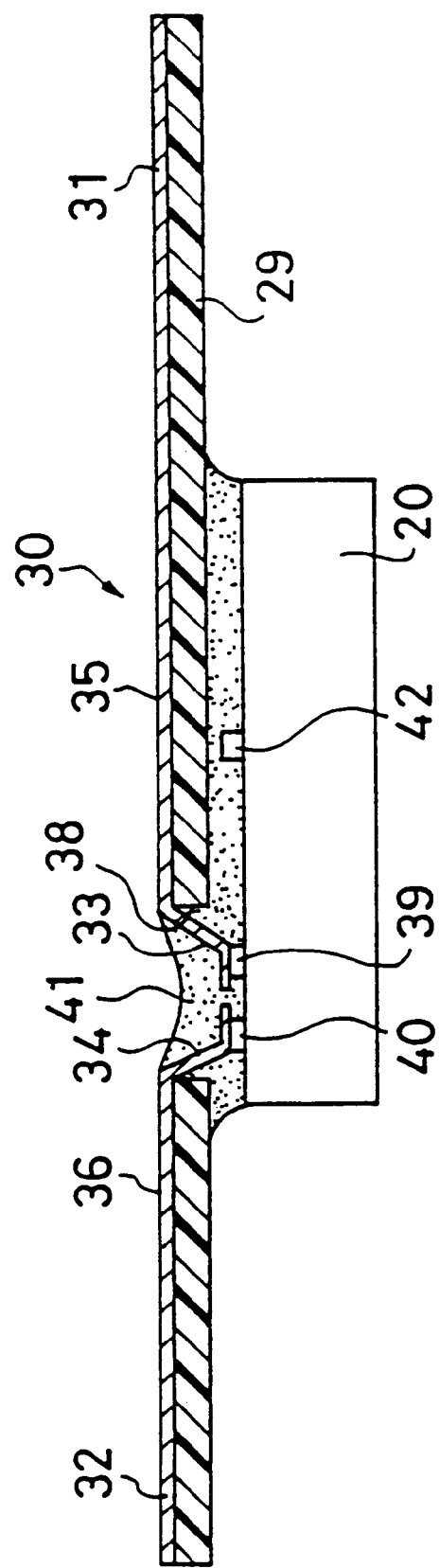
FIG. 3 is an enlarged cross sectional view along line III—III of FIG. 2.

As shown in FIG. 3, the electrodes of the semiconductor chip are formed with bumps 39, 40 thereon by, for example, gold-plating, and are connected to the inner leads 33, 34 by heating and pressing them with a bonding tool which is commonly employed in the field of inner lead bonding. Further, the inner leads are plated with tin on the surface thereof in order to achieve good weldability with the gold bumps 39, 40. The bonded part of the inner leads and the bumps and the space formed between the tape carrier 29 and the semiconductor chip 20 are sealed by filling the molding resin 41. The molding resin generally tends to spread out into a narrow gap by capillary action, and in this embodiment, as described before with reference to FIG. 1, the center of the row of output terminals 21 is widely opened so that the resin may easily flow and spread over the wide region inside the row of output terminals. Here, the semiconductor chip 20 may be provided with dummy bumps 42, as spacers between the tape carrier and the surface of the semiconductor chip, on the same surface where said electrodes are formed and inside the output terminals 21, so as to ensure that a sufficient space is defined between them or the flow of the molding resin is blocked. The dummy bumps 42 may be arranged properly at different positions other than the positions as illustrated in FIG. 2, for example along the long side opposite to said electrodes.

In another embodiment, the row of output terminals 21 can be divided into smaller groups by forming one or more additional gaps of about 500 microns, which is wider than the pitch of the electrodes, at any position other than the center of the row, so that the molding resin may flow over the surface smoothly through the gaps, and that design flexibility of the wirings 35 on the output side may be increased. Also, dummy bumps (not shown) can be formed in the row of electrodes 22, 23 on the input side, or additionally dummy inner leads (not shown) can be formed on the tape carrier 29 to connect to said dummy bumps, so that the molding resin is controlled not to flow out to excess into the gap on the input side between the tape carrier and the semiconductor chip, and also that it may increase the physical strength of bonding the input inner leads 34 and the semiconductor chip 20.

In this embodiment, as shown in FIG. 2, the dimensions of the TCP are set as follows: the length of the outer lead 31 on the output side to be L01=1.9 mm, the length of the molding resin 41 to be Lr=2.1 mm, the length of the outer lead on the output side 32 to be Lo2=0.9 mm, the length of the reinforcing tape portion for the input leads to be Lt=0.5 mm. Therefore, the total length of the TCP 30 is L01+Lr+Lo2+Lt=5.4 mm. Here, the length of the output outer leads L01 is determined by the size of a tool which is used when mounting this TCP 30 to the outside, for example, when connecting the TCP to the electrodes on a LCD as being described later, and the length of the input outer leads Lo2 is determined by the size of a tool which is used when soldering the leads to an external input and /or power supply circuit.

According to the invention, as being fully understood from FIGS. 2 and 3, the area of the output wiring 35 overlaps substantially the top of the semiconductor chip 20, so that the length of the TCP 30 can be shortened to the required minimum length. Also, the area of the wiring 35 is enlarged as much that the pitch of the output terminals 21 is increased, and the present invention in particular ensures relatively enough space to design routing of the wirings. And the increase of the output terminal pitch by several microns can be easily adjusted without any change in the dimension of the TCP. Thus according to the invention, because the design flexibility of the wirings and outer leads of a TCP may be increased, while the cost of the semiconductor chip 20 can be restrained to the optimum low level in relation to the degree of integration and size thereof, the size of a TCP can be reduced and its manufacturing cost can be lowered.

Figure 10:
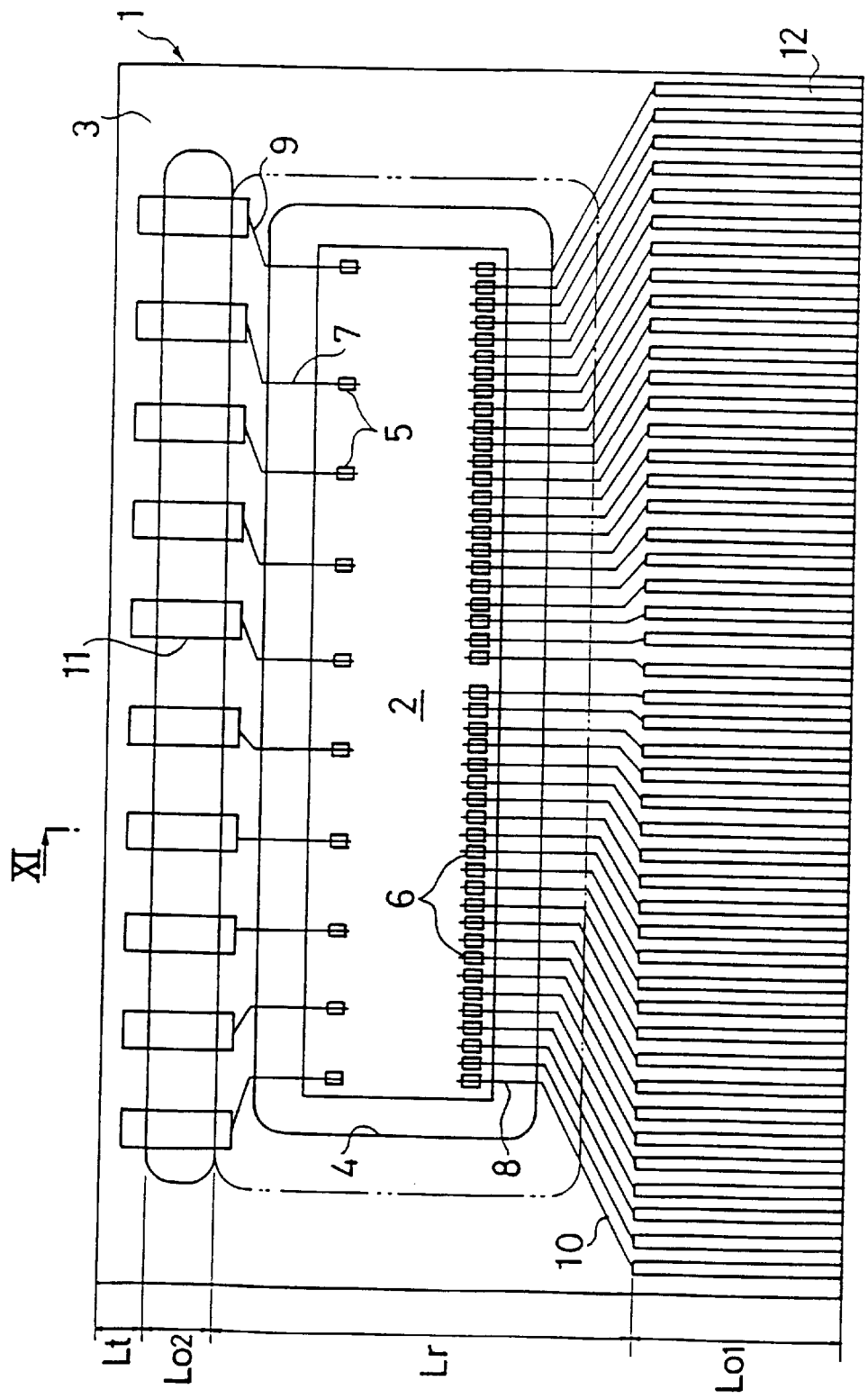
FIG. 10 shows a plan view of a TCP of the prior art.
Figure 11:
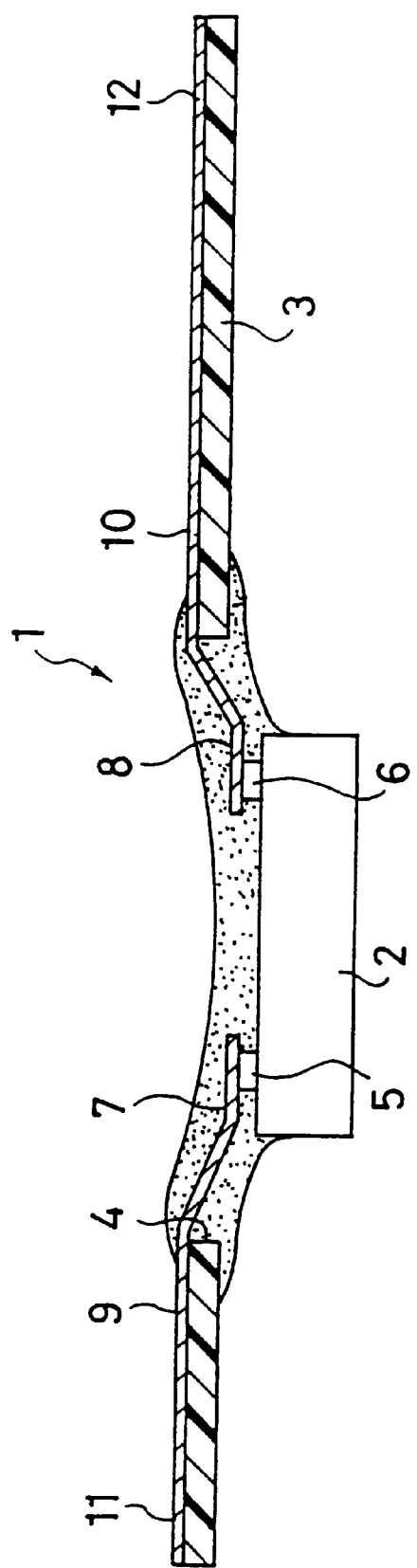
FIG. 11 is an enlarged cross sectional view along line XI—XI of FIG. 10.

In contrast, the conventional TCP 1 of FIG. 10 needs additional length of 1.3 mm for arranging the output wirings 10 outside the chip 2 and also needs additional space of 0.15×2=0.3 mm for the gap between the semiconductor chip 2 and the device hole 4, even when a semiconductor chip of the same dimensions as of the chip 20 is used. For that reason, the minimum length of the TCP 1 was limited to 7.0 mm, and it was practically impossible to make the length shorter than that. Further, if the pitch of the outer leads 12 increases, the area of the wirings 10 will become so much larger, and hence the size of the TCP 1 is increased.

Figure 4:
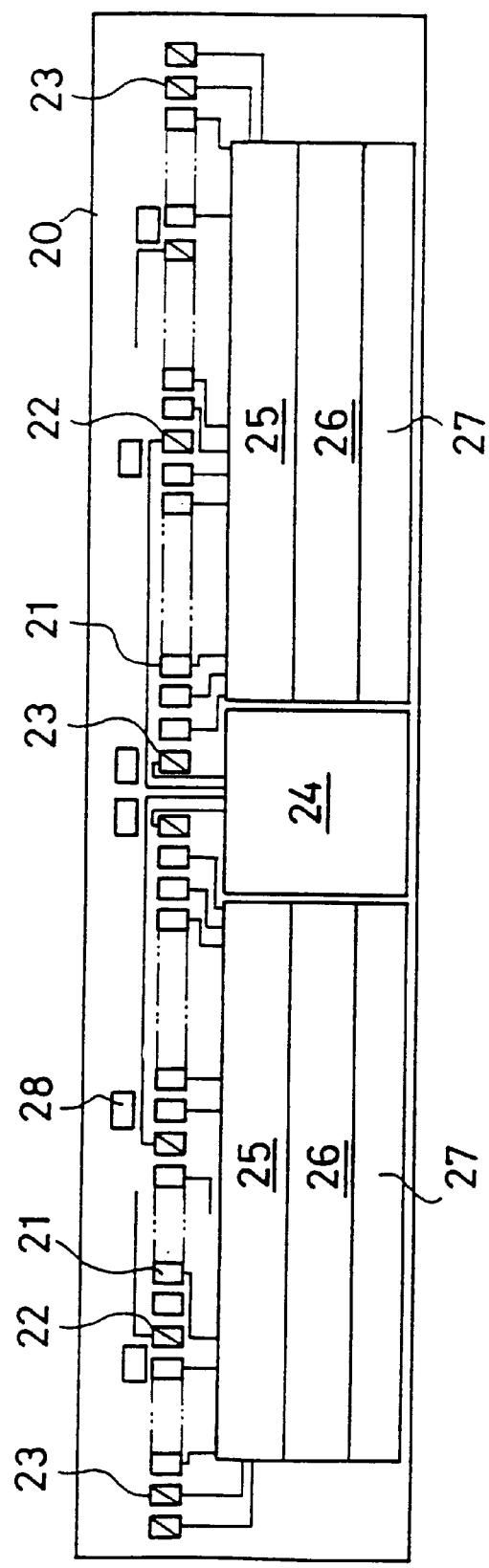
FIG. 4 shows a plan view of a second embodiment of the semiconductor device according to the invention.

In FIG. 4, there is shown the second embodiment of the semiconductor device of the invention. The semiconductor device of this embodiment is practically the same as that of the first embodiment except that all of the output terminals 21, input terminal& 22 and power supply terminals 23 are arranged in one row along one long side of the semiconductor chip 20. Therefore, the width of the chip 20 is longer than that of the first embodiment, while the length of the chip 20 is shorter than that of the first embodiment. In the region between said electrodes and the opposite long side of the chip, there are provided, as in the first embodiment, a logic region 24 in the center, and on both sides thereof driver output divisions 25, driver control divisions 26, and latch divisions 27 for holding serial data.

The output terminals are arranged at a constant pitch of about 60 microns, and are divided left and right into two groups by a wide gap which is formed in the center of the row of terminals, and each group of the output terminals are connected to the corresponding one of the left and right driver output divisions 25. Each group of the output terminals are further divided into three blocks with an interval of about 100 microns, and the input terminals 22 are arranged separately between the adjacent blocks and equally for each interval. The input terminals 22 are connected to the logic region 24 by the wiring passing through the gap in the center of the row of terminals. Two power supply terminals 23 for the logic region are positioned in the central gap and connected to the logic region 24. The power supply terminals 23 for the driver system are divided into two groups and arranged at both ends of the row of terminals for each group to be connected to the ends of the corresponding driver output division and the driver control division.

In this embodiment, while the input terminals and power supply terminals are 80×60 microns in size, the output terminals are 80×40 microns in size i.e. being narrower in width. This is for the purpose of preventing any short-circuit, when mounting the chip onto a tape carrier as being described later, which may be caused by the input inner leads and the output inner leads coming into contact with each other because they extend from opposite directions, and also for making the gaps, between the blocks of the output terminals which are separated by the input terminals 22, larger than the pitch of the output terminals.

The static electricity protective resistors and diodes 28 which are connected to the input terminals 22 are arranged outside the row of said output terminals etc. With this arrangement, the static electricity protective resistors and diodes 28 of the input system are separated from the driver system by at least the size of the output terminals, so that they may effectively prevent the driver system from being affected by surge of the input system.

Figure 5:
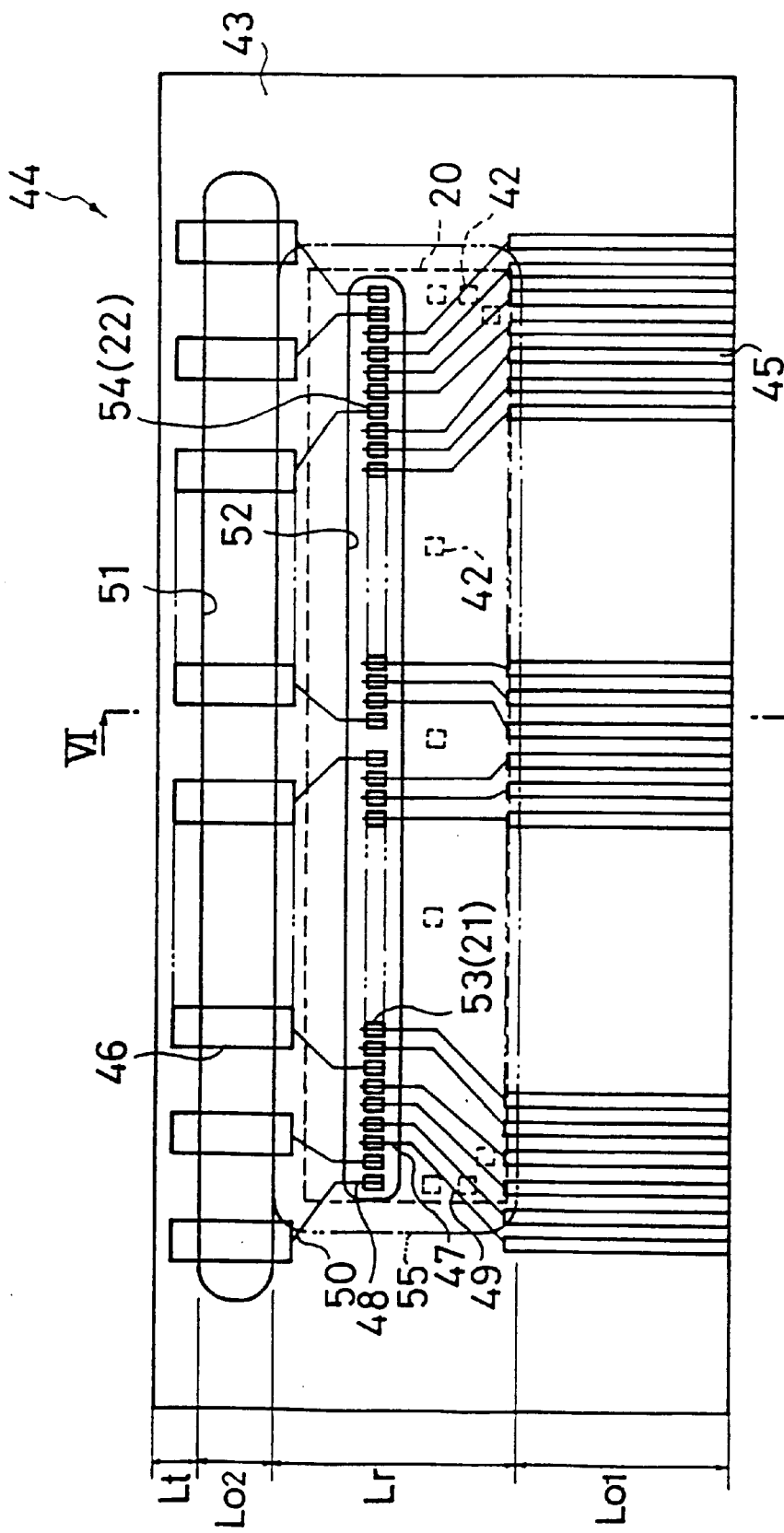
FIG. 5 shows a plan view of a TCP including the semiconductor device of FIG. 4.

In FIG. 5, there is shown a TCP 44 in which, as in the embodiment of FIG. 2, the semiconductor chip 20 of FIG. 4 is mounted onto a tape carrier 43 of a polyimide film of about 25 microns thickness. The TCP 43 is formed with outer leads 45, 46, inner leads 47, 48, and wirings 49, 50 for connecting the outer leads and the inner leads, by etching a copper foil of about 20 microns thickness. The output outer leads 45 are arranged at a constant pitch of 70 microns along one long side of the tape carrier, and the input outer leads 46 are arranged along the opposite long side of the tape carrier and are partly exposed to the back surface through a slit which is formed through the tape carrier 43.

A device hole 52 is formed in the tape carrier 43 at a position on the side of the input outer leads 46 rather than the center thereof. In this embodiment, because all of the electrodes of the semiconductor chip 20 are arranged in one row along the one long side thereof, the device hole 52 can be smaller in size than that of the first embodiment in FIG. 2. Therefore, the width or the longitudinal dimension of the TCP 44 can be reduced more than that of the first embodiment in FIG. 2. The input and output inner leads 47, 48 project into the opening of the device hole 52 from both side edges thereof in the opposite directions to overlap horizontally on the row of electrodes, and the length of the leads can be reduced less than that of a conventional TCP having a device hole larger than the semiconductor chip in size.

The inner leads 47, 48 of the TCP 44 are bonded to bumps 53, 54 which are formed on the electrodes of the semiconductor chip 20 by gold plating, through the steps of heating and pressing by means of a conventional bonding tool. The bonded part of the Inner leads and the bumps as well as the gap formed between the tape carrier 43 and the semiconductor chip 20 are sealed by a molding resin material 55. As described in the above, due to the gap formed at the center of the row of output terminals 21 and the other gaps formed to separate each group of electrodes into smaller blocks respectively, the molding resin material 55 which is supplied through the opening of the device hole 52 is a larger liable to flow over uniformly inside the electrodes of said chip.

In this embodiment, the output terminals 21 is divided into six blocks by the input terminals 22, and alternatively, the output terminals can be divided into more number of blocks by modifying the positions of the input terminals. Another advantage of dividing the output terminals into blocks is that it enhances design flexibility of the wirings, in particular the output wiring 49, on the tape carrier 43. Further, the surface of the semiconductor chip 20 formed with the electrodes may be provided with dummy bumps 42, as spacers for the gap between the tape carrier or as obstacles for blocking the molding resin material, inside said row of electrodes. Also in the TCP 44 of this embodiment, dummy bumps can be formed within the row of electrodes of the semiconductor chip 20, and dummy inner leads can be added to the tape carrier 43 to be connected with the dummy bumps, so that the mechanical strength of bonding the chip and the tape carrier can be increased.

Figure 6:
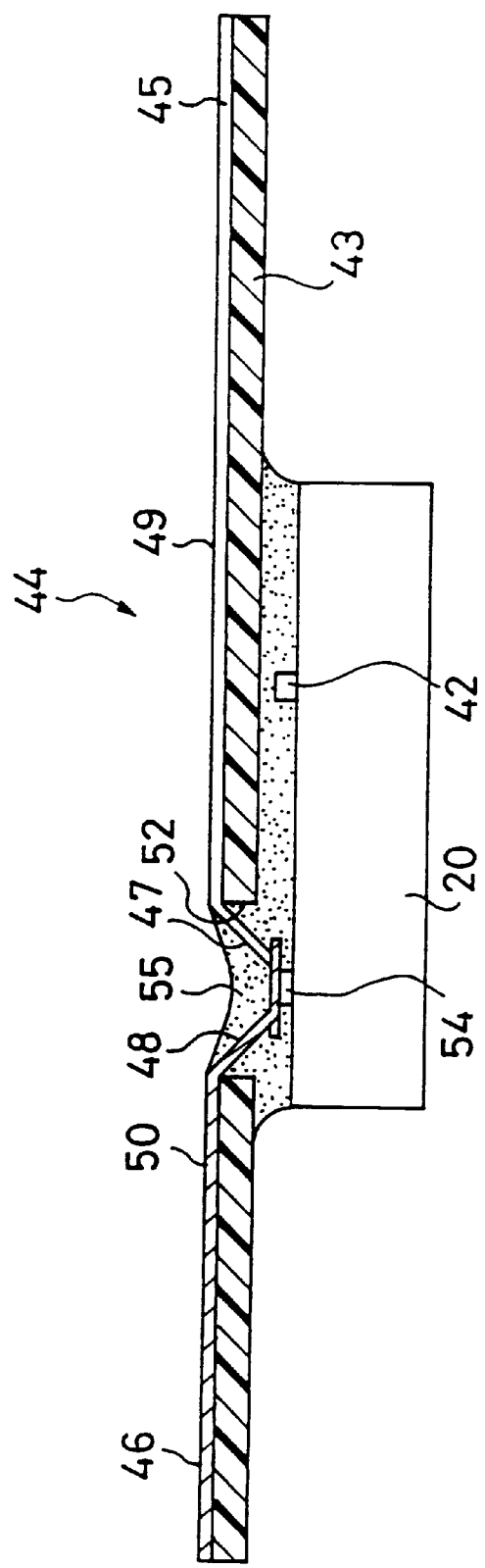
FIG. 6 is an enlarged cross sectional view along line VI—VI of FIG. 5.

As shown in FIG. 5, where the size of the TCP of this embodiment is set, as in the case of the TCP of the first embodiment, such that the length of the output outer leads 45 is Lo1=1.9 mm, the length of the molding resin material 55 is Lr=2.1 mm, the length of the input outer leads 46 is Lo2=0.9 mm, and the length of the input leads reinforcing tape part is Lt=0.5 mm, the total length of the TCP 44 is Lo1+Lr+Lo2+Lt=5.4 mm. Here, the length Lo1 of the output outer leads and the length of the input outer leads are determined by the size of a tool which is employed to connect the TCP 44 to an external circuit. As fully illustrated in FIGS. 5 and 6, the area of the output wirings 49 overlaps the top of the semiconductor chip 20 in the plan view, so that the longitudinal length of the TCP 44 can be largely reduced in relation to that of the conventional TCP of FIG. 10. Therefore, this embodiment is able to reduce the size of the TCP and to decrease its manufacturing cost, while minimizing the cost of the semiconductor chip 20. Further, in this embodiment, because the electrodes are arranged in one row, the width of the chip 20 can also be somewhat reduced, and to that extent the wirings and the outer leads can be designed more flexibly in comparison with the first embodiment.

Figure 7:
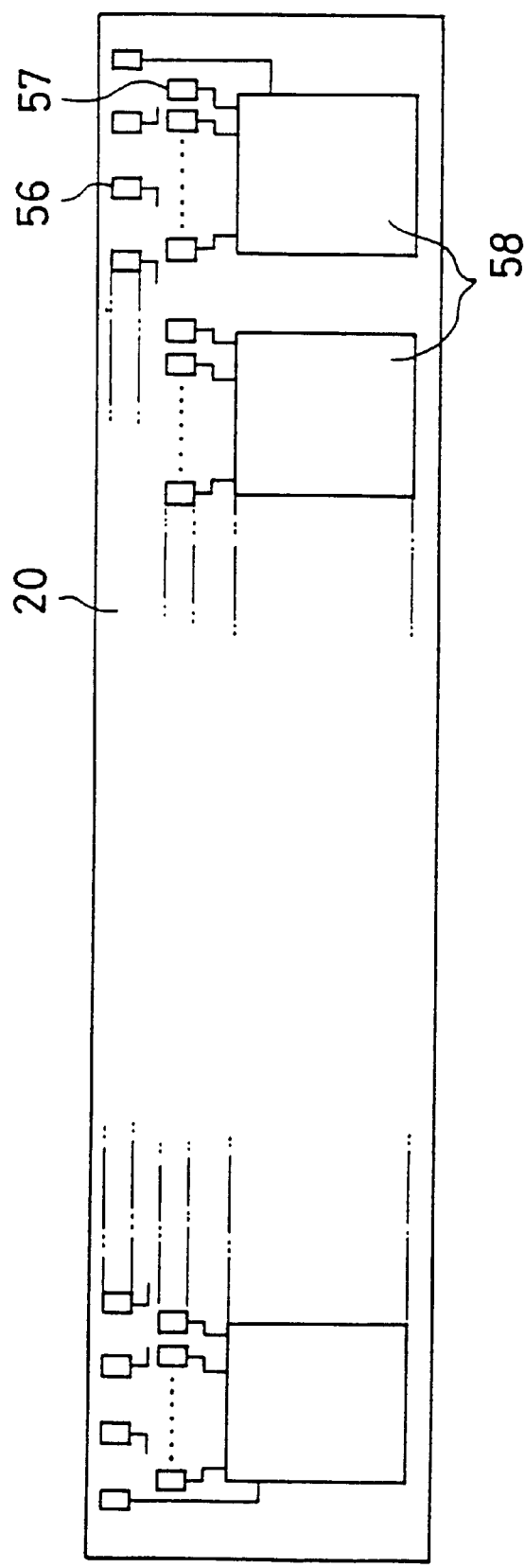
FIG. 7 shows a plan view of a modified embodiment of the semiconductor device according to the invention.

FIG. 7 shows a modification of the semiconductor device of the first embodiment. In this modified embodiment, a number of electrodes are arranged in two rows along one long side of the long and narrow rectangular shaped semiconductor chip 20. As in the case of the first embodiment, the outer row comprises the input and power supply terminals 56 and the inner row comprises the output terminals 57. There are provided in the area between said rows of electrodes and the opposite long side of the chip 20, a plurality of blocks each comprising a circuit cell at intervals along the longitudinal direction. The output terminals 57 are divided into groups to correspond with the circuit cells of the blocks into groups 58, and are connected to the blocks. Said input and power supply terminals are connected to the predetermined blocks 58 passing through the regions between said blocks. Also in this embodiment, as in the first and the second embodiments, the wirings for the output terminals 57 can be provided within the area on the tape carrier to overlap on the top the semiconductor chip, so that the mounting area can be reduced.

Figure 8:
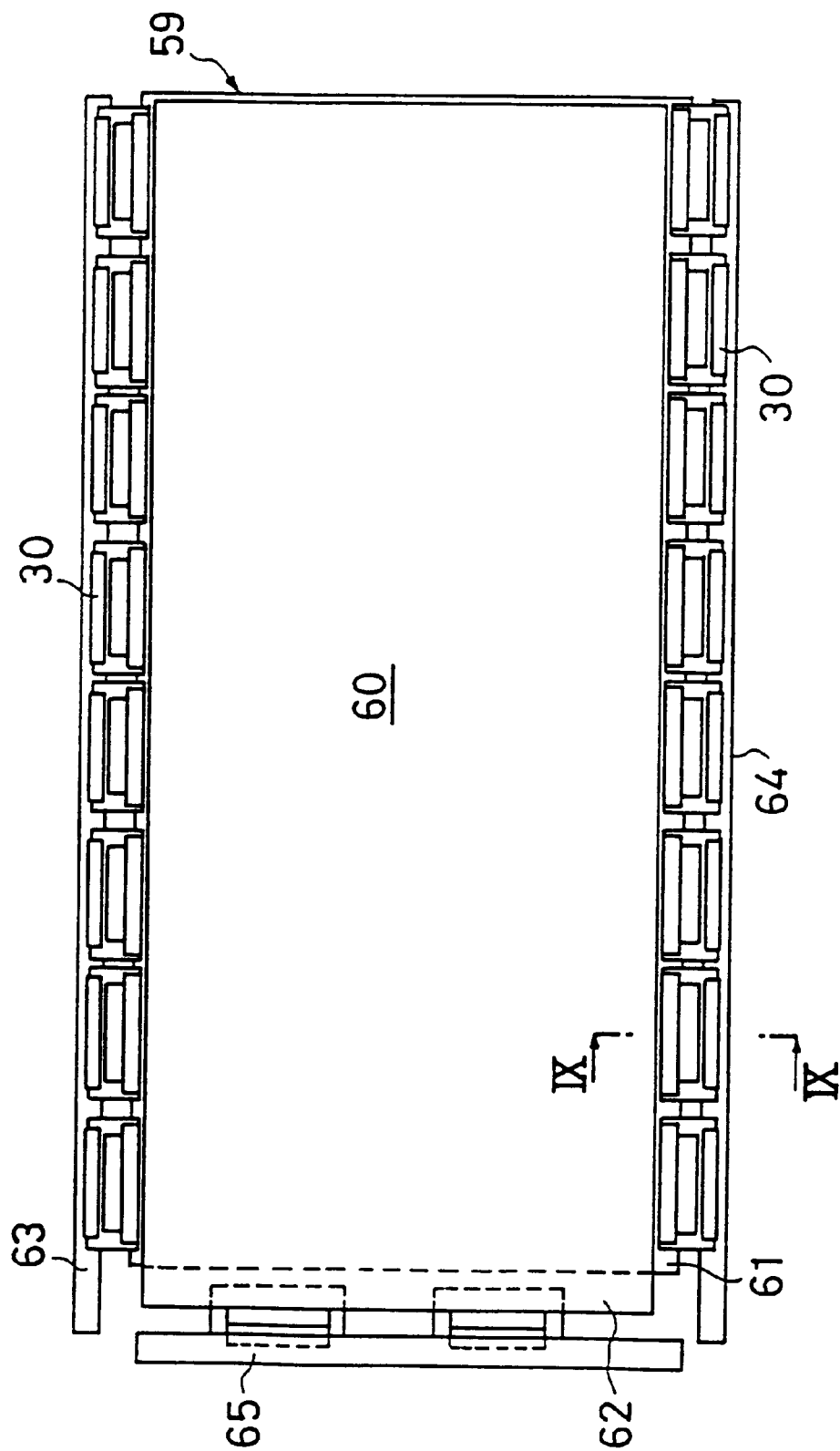
FIG. 8 shows a plan view of a liquid crystal display module according to the invention.
Figure 9:
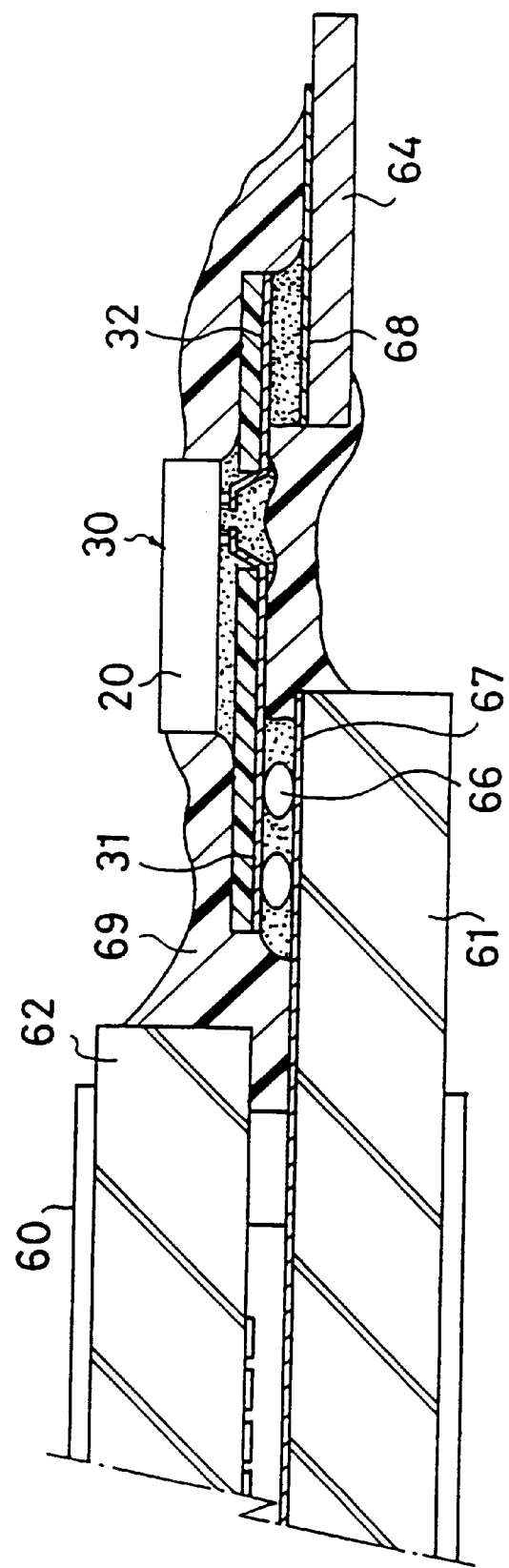
FIG. 9 is an enlarged cross sectional view along line IX—IX of FIG. 8.

In FIGS. 8 and 9, there is shown an embodiment of the LCD module according to the present invention. The LCD module 59 is of the color VGA type of 1920×480 pixels comprising a LCD panel 60 of X-Y matrix structure of electrodes, and the TCPs 30 of FIG. 2 on which a LCD driver semiconductor chip is mounted respectively are connected to said LCD panel such that eight of said TCPs are allocated in series along each of the upper and lower side edges of the glass substrate 61 respectively, and two of said TCPs are allocated along the left side edge of the other glass substrate 62. Strip circuit boards 63, 64 extending in the X direction are connected to the corresponding input terminals of the TCPs 30 on said upper and lower side edges respectively, and a strip circuit board 65 extending in the Y direction is connected to the TCPs 30 on the left side edge.

As fully illustrated in FIG. 9, the output terminals 31 of each TCP 30 are electrically and mechanically connected to the ITO electrodes on the surface of the glass substrate 61 by means of a well known anisotropic conductive layer 66. The same anisotropic conductive material is also used to connect the output terminals of the TCPs 30 on the right side edge to the ITO electrodes of the glass substrate 62. Alternatively, instead of the anisotropic conductive layer, a suitable adhesive agent can be used to directly connect said output terminals to the ITO electrodes. The input terminals 32 of each TCP 30 are connected to the output terminals 68 of the circuit boards 63 by soldering. Further, a molding resin material 69 is applied in order to protect the connections of the terminals of TCP 30 and said glass substrates and the connections of said terminals and the circuit boards.

As described above, the length of the TCP 30 is shorter than that of a conventional TCP, so that the frame or peripheral margin edge portions of the LCD module 59 can be made smaller than before. Therefore, the size of the entire LCD module 59 can be reduced, and in other words the size of the display screen can be made substantially larger in relation to the size of the entire device, so that an easy-to-see LCD device can be provided. As a matter of course, the TCP of the second embodiment as shown in FIG. 5 can be used for the LCD module 59 of the invention. Alternatively, TCPS of the conventional type can be used instead of the TCP 30 of the invention along the left side edge of the glass substrate 62. This is because, though in this case the transverse dimension of the LCD module 59 can not be minimized, in general the transverse dimension of most LCD devices is not strictly limited.

Also, the present invention can be applied not only to the above mentioned liquid crystal displays but also to any other type of flat panel display modules, such as plasma displays, which have driver semiconductor chips mounted on the perimeter thereof.

While the foregoing description with reference to the preferred embodiments of the invention contains many specific details, it will also be appreciated for those skilled in the art that many other variations or modification to the above embodiments are possible within the technical scope of the invention. For example, the electrodes of each row in FIGS. 1 and 4 can be arranged in zigzag entirely or partly at a suitable position along the length thereof instead of in a straight line. Also the layout of the circuit cells formed on the semiconductor chip can be varied differently in accordance with its purpose or desired specification. Further, the arrangement of the power supply terminals and/or the input terminals are not construed as limited to the above embodiments, but are able to be designed freely in accordance with the layout of the circuit cell, or the construction of an external device to which the TCP or other device of the invention is to be mounted.

I claim:

1. A semiconductor device comprising: a rectangular semiconductor chip having two long sides and two short sides; a plurality of circuit cells on said chip; and a plurality of electrodes for connecting said circuit cells to external devices, wherein said electrodes are disposed along a first long side of said chip and between said first long side and at least one circuit cell, and wherein a second long side of said chip is free of electrodes.

2. A semiconductor device of claim 1, wherein said electrodes comprise input terminals, output terminals and power supply terminals, and said input terminals and power supply terminals are arranged between said output terminals and said first long side.

3. A semiconductor device of claim 2, further comprising input protective resistors and static electricity protective diodes for said input terminals arranged between said output terminals and said first long side.

4. A semiconductor device of claim 2, wherein said output terminals are divided into at least two blocks, the output terminals of each block are separated from one another by a pitch and the blocks are separated from each other at least by a space larger than the pitch of the output terminals of each of said blocks.

5. A semiconductor device of claim 2, wherein said semiconductor chip is a driver for driving a flat type display panel, said output terminals include terminals to send drive signals to said display panel, and said input terminals include terminals to receive clock signals for converting the serial data into parallel signals.

6. A semiconductor device of claim 1, wherein said electrodes comprise input terminals, output terminals and power supply terminals, and are arranged in one row.

7. A semiconductor device of claim 6, wherein said output terminals are divided into at least two blocks, said input terminals are arranged between said blocks of the output terminals, and said power supply terminals are arranged at both ends of said row of the electrodes.

8. A semiconductor device of claim 6, further comprising input protective resistors and static electricity protective diodes for said input terminals arranged between said output terminals and said first long side.

9. A semiconductor device of claim 6, wherein said semiconductor chip is a driver for driving a flat type display panel, said output terminals include terminals to send drive signals to said display panel, and said input terminals include terminals to receive serial data and terminals to receive clock signals for converting the serial data into parallel signals.

10. A tape carrier package comprising: a tape carrier having a plurality of inner leads; a rectangular semiconductor chip having two long sides and two short sides; a plurality of circuit cells on said chip; said inner leads electrically connected to said chip along a first long side of said chip and between said first long side and at least one circuit cell, and wherein a second long side of said chip is free of lead connections.

11. A tape carrier package of claim 10, wherein said leads electrically connect to terminals on the chip, said terminals comprising input terminals, output terminals and power supply terminals, and said inner leads connected to the output terminals extend from the output terminals towards the second long side of the chip.

12. A tape carrier package of claim 11, wherein said semiconductor chip is a driver for driving a flat type display panel, said output terminals include terminals to send drive signals to said display panel, and said input terminals include terminals to receive serial data and terminals to receive clock signals for converting the serial data into parallel signals.

13. A tape carrier package of claim 10, wherein said semiconductor chip is a driver for driving a flat type display panel, said output terminals include terminals to send drive signals to said display panel, and said input terminals include terminals to receive serial data and terminals to receive clock signals for converting the serial data into parallel signals.

14. A display panel module comprising a flat type display panel having a perimeter and a plurality of tape carrier packages, each as defined in claim 10, wherein said packages are disposed along the perimeter of said panel and are connected to said panel for enabling said semiconductor chips of said packages to drive the display panel.

15. A display panel module of claim 14, wherein said display panel is a liquid crystal display panel.

* * * * *